United States Patent
Koh et al.

(10) Patent No.: US 7,847,567 B2
(45) Date of Patent: Dec. 7, 2010

(54) VERIFYING A PRINTED CIRCUIT BOARD MANUFACTURING PROCESS PRIOR TO ELECTRICAL INTERCOUPLING

(75) Inventors: GimHong Koh, Singapore (SG); MaoLong Wang, Singapore (SG); Srinivas Garrepally, Singapore (SG); Salim Ahmad, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 150 days.

(21) Appl. No.: 11/784,908

(22) Filed: Apr. 10, 2007

(65) Prior Publication Data

US 2008/0252311 A1    Oct. 16, 2008

(51) Int. Cl.
  *G01R 31/02* (2006.01)
(52) U.S. Cl. .................................. 324/754; 324/158.1
(58) Field of Classification Search ........................ None
  See application file for complete search history.

(56) References Cited

U.S. PATENT DOCUMENTS

| | | | | |
|---|---|---|---|---|
| 2,588,726 A | * | 3/1952 | Hoover | 439/189 |
| 3,361,869 A | * | 1/1968 | Gutbier et al. | 174/262 |
| 4,565,966 A | * | 1/1986 | Burr et al. | 324/519 |
| 5,966,020 A | * | 10/1999 | Rampone et al. | 324/755 |
| 6,158,119 A | * | 12/2000 | Crist et al. | 29/840 |
| 6,195,618 B1 | | 2/2001 | Rosenberg et al. | |
| 6,314,034 B1 | * | 11/2001 | Sugamori | 365/201 |
| 6,408,253 B2 | * | 6/2002 | Rosenberg et al. | 702/95 |
| 6,538,461 B2 | | 3/2003 | Novak et al. | |
| 6,664,778 B2 | | 12/2003 | Jacobsen et al. | |
| 6,731,104 B1 | * | 5/2004 | Yang | 324/110 |
| 2003/0225547 A1 | * | 12/2003 | Paradies | 702/150 |

* cited by examiner

*Primary Examiner*—Vinh P Nguyen
(74) *Attorney, Agent, or Firm*—Fellers, Snider, et al.

(57) ABSTRACT

Apparatus and method for performing a verification buy-off operation during an assembly manufacturing process, such as during printed circuit board (PCB) manufacturing. A processing device is configured to establish contact between a probe assembly and a first component of an assembly having a plurality of components loaded in predetermined positions but not yet electrically intercoupled, and to receive from the probe assembly a component value associated with the first component. Preferably, the processing device further determines whether the received component value is within a predetermined specification. The processing device preferably directs a user via a graphical user interface (GUI) to manipulate the probe assembly to a position proximate the first component. The GUI preferably provides a graphical representation of the assembly and a marker that identifies the location of the first component thereon. All of the components of the assembly are preferably verified individually prior to a full production run.

20 Claims, 4 Drawing Sheets

VERIFYING A PRINTED CIRCUIT BOARD MANUFACTURING PROCESS PRIOR TO ELECTRICAL INTERCOUPLING

BACKGROUND

Assembly manufacturing processes often undergo a verification (buy-off) operation to verify machinery setup, such as after a conversion from the manufacture of one type of assembly to another. The buy-off operation may help to reduce costly errors from being introduced into a full production run.

SUMMARY

Embodiments of the present invention are generally directed to an apparatus and method for performing a verification (buy-off) operation in an assembly manufacturing process, such as during printed circuit board (PCB) manufacturing.

In accordance with various embodiments, a processing device is configured to establish contact between the probe assembly and a first component of an assembly having a plurality of components loaded in predetermined positions but not yet electrically intercoupled, and to receive from the probe assembly a component value associated with the first component.

DETAILED DESCRIPTION

Figure 1:
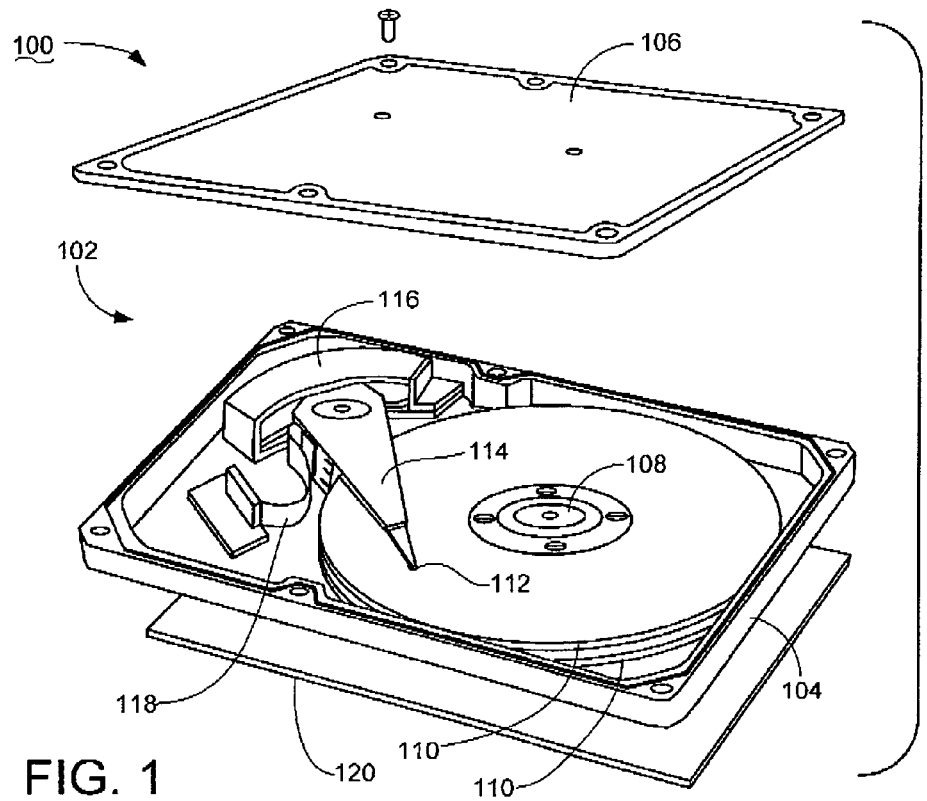
FIG. 1 is an exploded isometric view of an exemplary data storage device.

FIG. 1 provides a top plan view of a data storage device 100. The device 100 is provided to show an exemplary application in which various embodiments of the present invention may be utilized. It will be understood, however, that the claimed invention is not limited to the exemplary embodiments disclosed herein.

The device 100 includes a housing 102 formed from a base deck 104 and top cover 106. An internally disposed spindle motor 108 is configured to rotate a number of storage media 110. A head stack assembly 114 preferably rotates through application of current to a voice coil motor (VCM) 116. Controlled operation of the VCM 116 aligns an array of transducers 112 with tracks (not shown) defined on the media surface to store and retrieve data, respectively.

A flex circuit assembly 118 provides electrical communication paths between the actuator 114 and device control electronics on an externally disposed printed circuit board (PCB) 120. The PCB 120 preferably provides various control circuitry and routines enabling the functioning and operation of the various components of the device 100 shown in FIG. 1.

The PCB 120 is preferably produced en masse in an automated manufacturing process in which many hundreds or thousands of nominally identical printed circuit boards may be produced in a relatively short amount of time using automated machinery. When a new PCB is designed, it may be with the assistance of a computer aided design, or CAD program. Thus, a CAD file specifying the layout of the PCB 120 may generated and available for use. It is further contemplated that an electronic bill of materials (BOM) specifying the values, types, and tolerance of each of the electronic components of the PCB 120 may also be generated and available for use.

Figure 2:
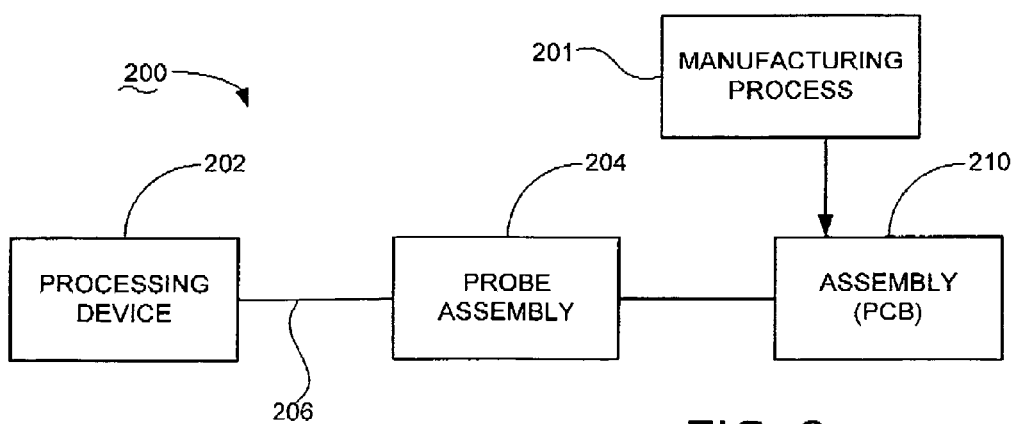
FIG. 2 is block diagram of a preferred embodiment for a system for performing a verification (buy-off) operation for an assembly manufacturing process.

FIG. 2 provides a generalized block diagram for a system 200 preferably configured to perform a verification (buy-off) operation during a manufacturing process 201 used to manufacture a population of assemblies, such as but not limited to PCBs as exemplified at 120 in FIG. 1. Preferably, the buy-off operation verifies the configuration steps utilized to set up the manufacturing process 201 in preparation for one or more production runs; for example, in the context of a PCB manufacturing process the buy-off operation preferably verifies automated machinery settings, component loader configurations, installation tooling setups, and so on.

The system 200 of FIG. 2 preferably comprises a processing device 202 coupled to an electronic probe assembly 204. The processing device 202 is preferably connected to the probe assembly 204 via an electronic data bus 206 for command and data transfers using a suitable communication protocol.

As explained below, the processing device 202 preferably operates to establish contact between the probe assembly 204 and a first component of an assembly 210 (such as a PCB) comprising a plurality of components loaded in predetermined positions but not yet electrically intercoupled, and to receive from the probe assembly a component value associated with the first component.

The processing device 202 can take any number of desired forms, such as but not limited to a commercially available personal computer, a laptop, a handheld computing device, a special purpose machine controlled via electronic hardware or software, etc. The probe assembly 204 can also take any number of forms, such as but not limited to a multi-meter, a resistance, capacitance, and inductance (RCL) meter, a custom built probe assembly designed to test specific types of electronic components or integrated circuitry, etc.

The probe assembly 204 can further be fully automated with one or more articulating robotic arms and multi-axis positional feedback (e.g., optical) sensing, or can be manually or semi-manually operated by a user. The data bus 206 can take any number of desired forms, such as but not limited to a serial connection, a parallel connection, an RS232 connection, a wireless connection such as Bluetooth, or a data bus designed specifically to meet the needs of the system 200.

Figure 3:
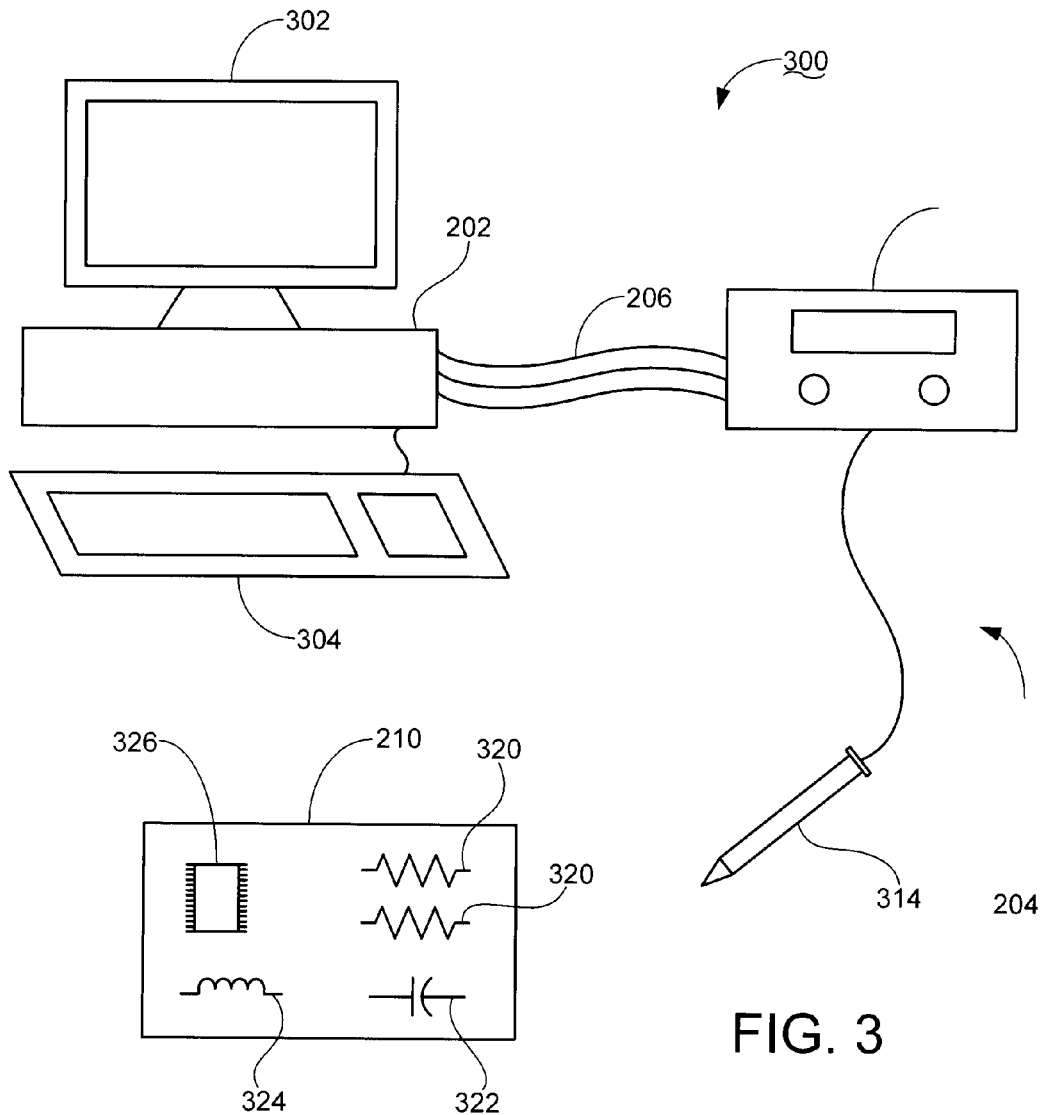
FIG. 3 is a component diagram for a system that performs a buy-off operation for a printed circuit board (PCB) manufacturing process.

FIG. 3 shows an embodiment of the system of FIG. 2 in greater detail. The system in FIG. 3 is numerically denoted at 300 and is specially configured to perform a buy-off operation for a test-run PCB 210 generated from a PCB manufacturing process. As explained below, the PCB 210 under test is preferably fully populated with associated components by the manufacturing process, but without the components being electrically intercoupled (e.g., through the application of a solder reflow operation, etc.).

In FIG. 3, the processing device 202 is characterized as a personal computer, and preferably includes a graphical user interface (GUI). The graphical user interface is preferably provided via a display device 302 that may also be touch-sensitive. In other embodiments, other input devices such as a keyboard 304 may also be used for user I/O operations. The data bus 206 of FIG. 2 is contemplated in FIG. 3 as comprising an RS232 connection. The probe assembly 204 of FIG. 2 is contemplated in FIG. 3 as comprising a resistance, capacitance and inductance (RCL) meter 312 to test circuit components. The RCL meter 312 can be any of a number of readily commercially available units with appropriate resolution and accuracy characteristics and host interface features for the system requirements.

The probe assembly 204 further preferably comprises one or more component probes such as represented at 314. The probe(s) 314 preferably interconnect the RCL meter 312 with the PCB 210 being tested. Other probe configurations, including a plurality of different types of probes, can be used as desired.

Figure 3A:
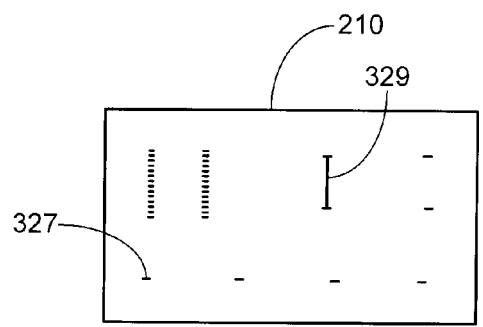
FIG. 3A illustrates the PCB of FIG. 3 Prior to the loading of the components as shown in FIG. 3.

As shown in the simplified illustration of FIG. 3, the PCB 210 preferably provides mounting locations for multiple components such as resistors 320, a capacitor 322, an inductor 324, and an integrated circuit chip 326. Although only a limited number of exemplary components are shown, it will be understood that other printed circuit boards may have many components of various sizes, values, tolerances, pin-out configurations and other specified characteristics. FIG. 3A shows the PCB 210 prior to the loading of the components in FIG. 3 to illustrate exemplary mounting locations 327. It is contemplated that an electronic bill of materials (BOM) and at least one CAD file are available for the PCB 210, although such are not necessarily required for operation by the system 300.

Figure 4:
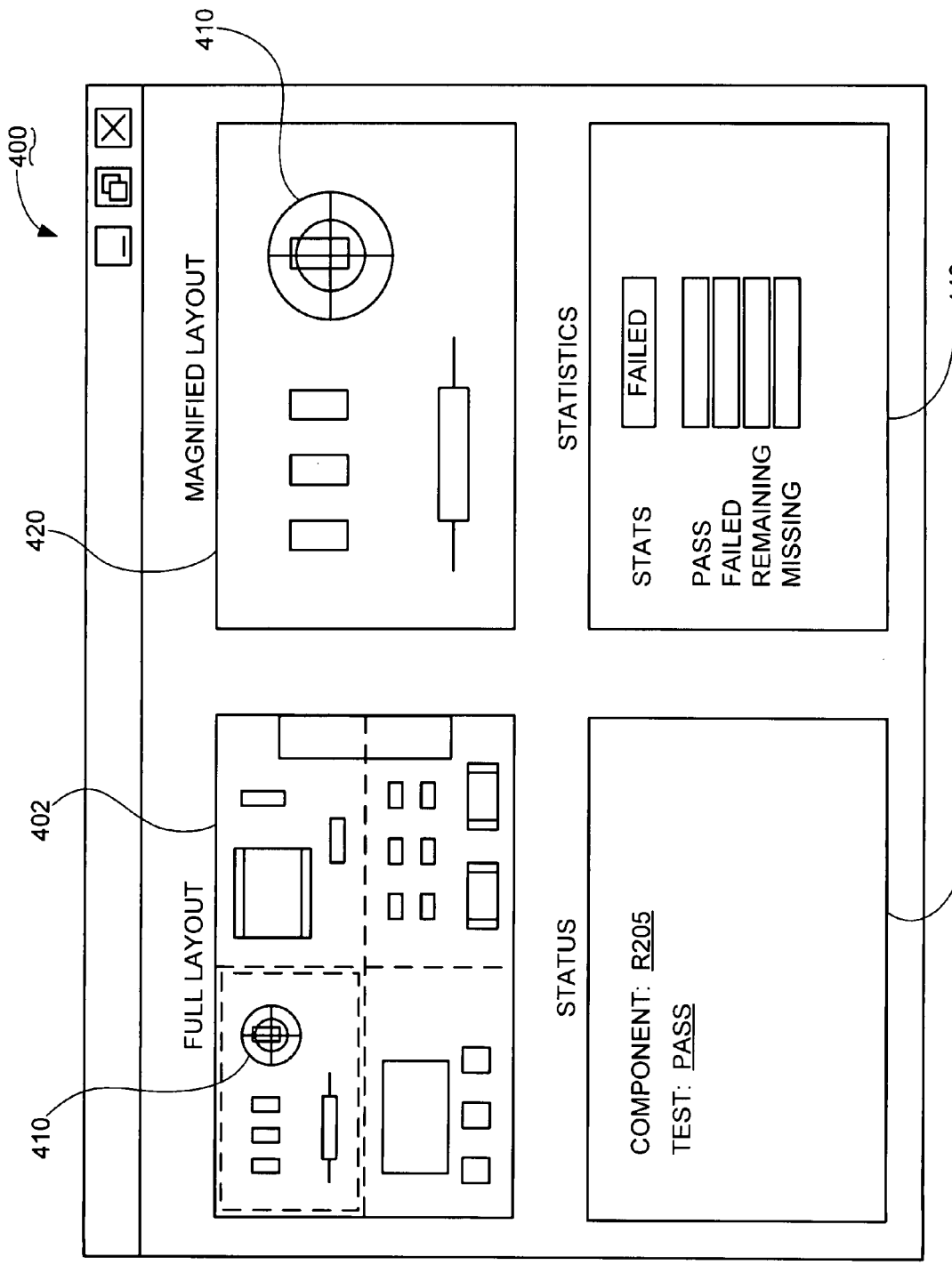
FIG. 4 is a screen shot representation of a graphical user interface (GUI) that can be used with the systems described herein for completing the buy-off operation for a printed circuit board manufacturing process.

FIG. 4 provides a generalized representation of a graphical user interface (GUI) preferably used with the system of FIG. 3, characterized as a display (screen shot) 400 provided on the display device 302. It will be understood that the screen shot 400 of FIG. 4 is merely exemplary, and a number of possible variations thereof can be used with the system described herein. The screen shot 400 is preferably produced on the device 302 of FIG. 3 via execution of Microsoft Windows® based programming by the processing device 202.

The screen shot 400 is preferably divided into sections adapted to convey various types of information to a user. Window 402 graphically depicts the full layout of the printed circuit board being tested, so that various electronic components, integrated circuits, and connectors on the board are depicted graphically substantially in the correct location. This information may be derived from the aforementioned CAD file and/or electronic bill of materials.

The printed circuit board is subdivided as shown by the dashed lines in the layout window 402. A single section can be highlighted that corresponds to the section of the printed circuit board currently under evaluation. A reticule 410 is provided to specify a particular component being tested out of all of the components on the print circuit board. To further aid a user of the system, a magnified layout window 420 is also preferably provided. The magnified layout window 420 preferably corresponds to the highlighted or active section of the full layout window 402. As desired, real-time images of the PCB under evaluation can additionally or alternatively be displayed.

In FIG. 4, the reticule 410 is shown highlighting the same component in both the full layout window 402 and the magnified layout window 420. It is contemplated that the reticule 410 is automatically advanced by the system to each of the components on the printed circuit board in turn, although the reticule 410 can also, or alternatively, be manually advanced by the user via the GUI interface (e.g., a mouse, keystrokes, etc.).

A status window 430 preferably shows an identifier, such as a label or name, of the component currently being tested. The results of a current test operation can also be displayed, as well as additional user prompts. A statistics window 440 is also preferably provided with multiple tabs enabling the user to retrieve various information on the condition of the board and buy-off process. The statistics window 440 also preferably provides information relating to the number of components on the circuit board that have passed, the number that have failed, how many are remaining, and how many components are missing.

The user preferably uses the probe assembly 204 and the GUI to proceed through the verification of the printed circuit board under consideration. Preferably, the various components are physically loaded onto the printed circuit board in accordance with the newly setup manufacturing process, but the loaded PCB is not subjected to a reflow soldering or other process normally applied to complete the various electrical interconnections. As desired, various components can be temporarily affixed onto the printed circuit board through the application of adhesives, tapes, or other mechanical fastening devices and/or materials. Intervening insulators or other materials can also be placed as desired to ensure electrical isolation of various components for the verification process.

Evaluating a loaded but not yet fully interconnected assembly in this manner preferably allows for component evaluation on an individual or subgroup basis. For example, using this approach may allow the characterization of individual impedance values for components (e.g., resistors, capacitors, etc.) that are normally connected in parallel (such as by conductive pathway 329 in FIG. 3A), thereby reducing the risk that erroneously valued components have been installed in such locations. Similarly, chips or other devices (or subgroups, thereof) that cannot necessarily be individually characterized once permanently interconnected with the PCB can be isolated and separately evaluated.

In this way, the buy-off operation preferably verifies that an assembly, such as a PCB loaded with components as specified by a CAD file and/or a BOM, has been formed properly by the manufacturing process prior to initiation of a large production run.

Figure 5:
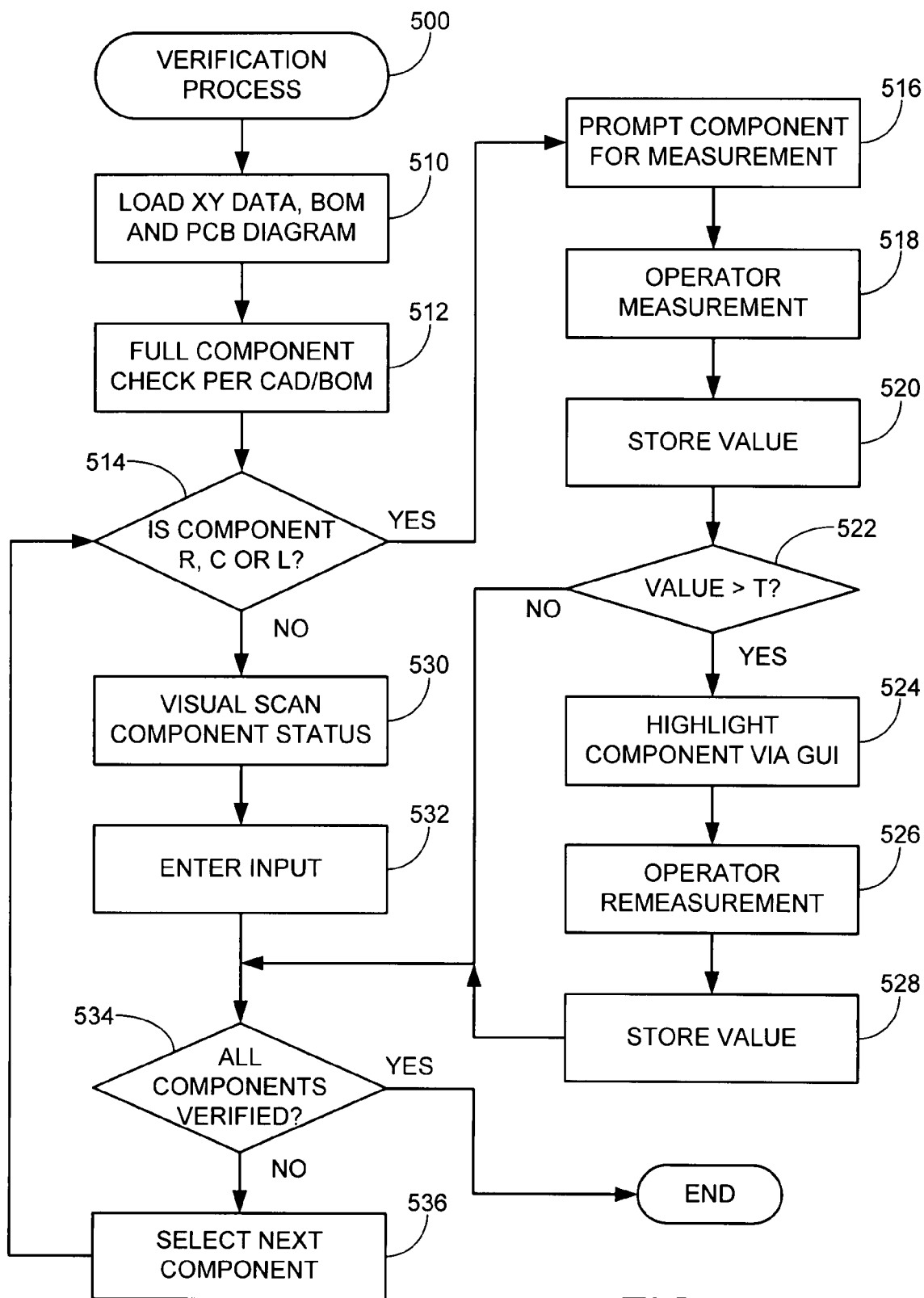
FIG. 5 is a flowchart for a VERIFICATION PROCESS routine generally illustrative of steps carried out in accordance with various embodiments of the present invention.

FIG. 5 sets forth a generalized flow chart for a VERIFICATION PROCESS routine 500, generally illustrative of steps carried out in accordance with various embodiments of the present invention. The routine 500 is preferably carried out using the systems previously described herein to verify a PCB manufacturing process, although such is not limiting.

At step 510, information relating to the assembly under evaluation (in this case the exemplary PCB 210 of FIG. 3) is initially provided to a processing device (such as the device 202 in FIGS. 2 and 3). Preferably, the information comprises component location data, an electronic bill of materials, and a printed circuit board diagram from an associated CAD. Those skilled in the art will recognize that component location data may be derived from the CAD file or separately generated.

A full component check according to the information provided during step 510 next preferably commences at step 512. As discussed above, this preferably involves a sequential evaluation of each component in turn. While various embodiments contemplate some measure of user intervention during the evaluation process, it will be appreciated that steps 512 and following can alternatively be fully automated, as desired.

The routine preferably distinguishes among various different types of components and provides suitable verification for each. Thus, a determination is preferably made at decision step 514 as to whether the particular component currently being verified is a resistor, capacitor, or inductor. If so, the method preferably proceeds to step 516 where the user is prompted to characterize the associated component. This is preferably carried out via the GUI such as by a text message, an audio cue, or by other means.

At step 518, the user or operator preferably measures the value of the component using the probe assembly. In some embodiments, the user couples the RCL meter 312 to the component being tested via one or more of the probes 314, and the RCL meter determines an associated value of the component. The RCL is preferably auto-ranging so as to automatically measure ohms for resistance, farads for capacitance, and henrys for inductance in the appropriate ranges.

As has been described, both the location and the desired value and tolerance for the component will have been previously specified by the CAD file and the bill of materials. Therefore, step 522 preferably determines whether or not the value measured at step 520 is out of limit (e.g., beyond a selected threshold value T, etc.). If the value is out of limit, at step 524 an indication of such is indicated via the GUI. The user is preferably prompted at step 526 to re-measure the component, and the newly acquired value is stored at step 528. Preferably, the probe assembly electronically communicates the value obtained by the measurement to the processing device during this step. In this manner, the user is not required to note or transcribe any values which could lead to errors in the testing.

Returning to decision step 514, in the event that the component being tested is not a resistor, capacitor, inductor, a different branch of the routine is preferably utilized. In some embodiments, the user is directed to carry out a visual scan of the component, step 530. During this step, the user verifies whether the component physically located on the board is the proper component for the circuit, as specified in the CAD file or electronic BOM. The user may refer to the GUI for such information, as desired. Preferably, the user also verifies the component being tested has the same physical shape and pinout as the component specified by the CAD file/BOM.

At step 532, the user provides input into the processing device indicating whether or not the visually checked component passes or fails. In one embodiment, the user may use the input device 304 to communicate with the processing device 202, as shown in FIG. 3. The user may be prompted to provide such input as "correct," "missing," "wrong orientation," "misalignment," or "other" in order to aid the data collection at this step. Thus, even for components that are not easily testable by electronic meters, a user will be able to track the correct placement, insertion, and orientation of the device.

While FIG. 5 shows substantially visual verification of non-passive components, it will be appreciated that in other embodiments, the probe assembly can be configured to carry out any number of appropriate electrical signal characterizations, such as functional testing, memory data accesses, application of drive current, etc. with the associated component.

Following the testing of the specified component, whether visually or using a probe assembly, a determination is made at step 534 as to whether all components have been checked and measured. If so, then the routine 500 ends. Otherwise, the next component is selected at step 536 and the foregoing steps are repeated until all components have been verified.

At the conclusion of the routine 500, a report is preferably produced to summarize the results of the verification process. The report can contain statistics related to the buy-off verification operation, as well as information regarding in specific failed components. The report can be used to enact any adjustments or corrections to the manufacturing setup as required to correct the deficiencies (if any) noted in the report. As desired, a new assembly can be generated from the updated process setup and the routine 500 can be carried out to verify the new manufacturing settings.

The results of the routine 500 can also be displayed graphically such as via the GUI. For example, a graphical overlay can be provided onto the displayed graphical representation of the PCB, with different colors, shapes and/or other markers used to highlight various status modes for the various components (e.g., green for pass, red for wrong component installed, etc.). Historical data can also be saved and evaluated for long term trend detection, analysis and process improvement efforts.

It will now be appreciated that the various embodiments of the present invention as described herein are well adapted to attain the ends and advantages mentioned above as well as those inherent therein. While presently preferred embodiments have been described for purposes of this disclosure, numerous changes and modifications will be apparent to those of ordinary skill in the art. Such changes and modifications are encompassed within the spirit of this invention as defined by the claims.

What is claimed is:

1. A method comprising steps of:
    establishing contact between a probe assembly and a component loaded by an automated manufacturing process onto a position adjacent a conductive mounting location of a printed circuit board (PCB), the component mechanically affixed to and not electrically intercoupled with the PCB; and
    transferring a component value associated with the component from the probe assembly to a processing device, wherein the processing device initiates the establishing step.

2. The method of claim 1, further comprising verifying, via the processing device, that the component value is within a predetermined specification range.

3. The method of claim 1, wherein the establishing step comprises operation of the processing device to direct a user to manipulate the probe assembly to a position proximate the component.

4. The method of claim 1, wherein the component value of the transferring step comprises at least a selected one of a resistance, a capacitance, or an inductance value of the component.

5. The method of claim 1, wherein the PCB is loaded with said component in accordance with a printed circuit board manufacturing process configured to produce a plurality of nominally identical PCBs during a normal production run.

6. The method of claim 1, wherein the component is connected to the PCB in accordance with said automated manufacturing process that comprises an interconnection operation wherein a permanent electrical interconnection is established between the component and the conductive mounting location of the printed circuit board, and wherein the PCB is not subjected to said interconnection operation prior to the establishing and transferring steps.

7. The method of claim 1, wherein the component is temporarily affixed to the PCB during the establishing step via adhesive.

8. The method of claim 1, wherein the establishing step comprises bringing the probe assembly into contacting abutment with an electrically conductive pin of the component, said pin electrically insulated from the PCB.

9. The method of claim 1, the component comprising an electrically conductive pin that is electrically isolated from a conductive mounting location for the component on the PCB by an intervening insulator.

10. A method comprising:
using an automated manufacturing process to load a component onto a printed circuit board (PCB) at a desired location thereon;
establishing contact between a probe assembly and the loaded component while the component is mechanically affixed to the PCB and while the component is not electrically interconnected with the PCB; and
verifying the manufacturing process responsive to a component value obtained from the probe assembly during the establishing step.

11. The method of claim 10, wherein using step comprises using adhesive to adhere the component to the PCB.

12. The method of claim 10, wherein the using step comprises inserting an intervening insulator between an electrically conductive pin of the conductor and a conductive mounting location of the PCB adapted to be electrically interconnected to said pin by a reflow solder operation of the manufacturing process so that said pin is not electrically coupled to said conductive mounting location.

13. The method of claim 10, wherein the component is characterized as a first component and the PCB is characterized as a first PCB, and wherein the method further comprises subsequently using the verified manufacturing process to load a second component nominally identical to the first component onto a second PCB nominally identical to the first PCB at said desired location thereon and soldering an electrically conductive pin of the second component to said second PCB responsive to the verifying step.

14. The method of claim 13, wherein the first component is not soldered to the first PCB during operation of the verifying step.

15. The method of claim 10, wherein the verifying step comprises transferring a component value associated with the component from the probe assembly to a processing device which compares the component value to a specified range for said component to verify the manufacturing process.

16. The method of claim 10, wherein the manufacturing process of the using step employs automated equipment to load the component to the PCB.

17. The method of claim 16, wherein the verifying step determines that the automated equipment correctly loaded the component onto the PCB.

18. A method comprising:
loading a first component onto a first desired location of a first printed circuit board (PCB) using an automated manufacturing process having an initial setting;
establishing contact between a probe assembly and the component while the component remains loaded onto the PCB without said component being in electrical contact with the PCB; and
adjusting the initial setting of the manufacturing process to a final setting responsive to a component value obtained from the probe assembly during the establishing step.

19. The method of claim 18, further comprising subsequently using the manufacturing process with said final setting to load a second component nominally identical to the first component to a second PCB nominally identical to the first PCB at a second desired location corresponding to the first desired location, and electrically interconnecting the second component to the second PCB.

20. The method of claim 18, wherein the loading step comprises adhering a body portion of the first component to the first PCB and inserting an intervening insulator between an electrically conductive pin of the first component and a conductive mounting location of the PCB adapted to be electrically interconnected to said pin by a reflow solder operation.

* * * * *